United States Patent
Briano

(10) Patent No.: US 10,074,713 B1
(45) Date of Patent: Sep. 11, 2018

(54) SIGNAL ISOLATOR INTEGRATED CIRCUIT PACKAGE

(71) Applicant: Allegro MicroSystems, LLC, Worcester, MA (US)

(72) Inventor: Robert A. Briano, Hampton, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/705,487

(22) Filed: Sep. 15, 2017

(51) Int. Cl.
*H01L 29/00* (2006.01)
*H01L 49/02* (2006.01)
*H01L 23/00* (2006.01)
*H01L 25/18* (2006.01)

(52) U.S. Cl.
CPC .............. *H01L 28/40* (2013.01); *H01L 24/48* (2013.01); *H01L 25/18* (2013.01); *H01L 2224/48195* (2013.01); *H01L 2224/48265* (2013.01); *H01L 2924/19041* (2013.01); *H01L 2924/19104* (2013.01)

(58) Field of Classification Search
CPC ......... H01L 28/40; H01L 28/60; H01L 24/48; H01L 25/16; H01L 25/18
USPC ....................................... 257/532
See application file for complete search history.

(56) References Cited

U.S. PATENT DOCUMENTS

| | | | |
|---|---|---|---|
| 6,989,665 B2 * | 1/2006 | Goto | .................... G01R 15/202 324/117 H |
| 7,598,601 B2 | 10/2009 | Taylor et al. | |
| 8,080,994 B2 | 12/2011 | Taylor et al. | |
| 8,169,108 B2 | 5/2012 | Dupuis et al. | |
| 2008/0158777 A1 | 7/2008 | Sohn et al. | |
| 2008/0279288 A1 | 11/2008 | Crawley et al. | |
| 2013/0335882 A1 | 12/2013 | Ma et al. | |
| 2016/0282388 A1 | 9/2016 | Milano et al. | |

OTHER PUBLICATIONS

Daughton "Spin-Dependent Sensors" IEEE, vol. 91, No. 5, May 2003, 6 pages.

\* cited by examiner

Primary Examiner — Theresa T Doan
(74) *Attorney, Agent, or Firm* — Daly, Crowley, Mofford & Durkee, LLP

(57) ABSTRACT

A signal isolator integrated circuit package includes a first die in a first voltage domain and a second die in a second voltage domain. The integrated circuit package also includes a first signal path from the first die to the second die via a first isolation barrier supported by the first die. The first isolation barrier includes a first conductive layer disposed over a surface of the first die and a first insulating layer disposed over the first conductive layer. The first isolation barrier also includes a second insulating layer disposed over the first insulating layer and a second conductive layer disposed over the second insulating layer. A first floating conductive plate is disposed between the first insulating layer and the second insulating layer.

20 Claims, 6 Drawing Sheets

SIGNAL ISOLATOR INTEGRATED CIRCUIT PACKAGE

BACKGROUND

As is known in the art, signal isolators can be used to transfer signals (e.g., digital and/or analog signals) between circuits or systems operating in different voltage domains. As is also known in the art, signal isolators can be used in a variety of applications. In hybrid electric vehicle (HEV) applications, for example, signal isolators can be used to transfer signals between higher voltage systems and lower voltage systems of a HEV for controlling operation of the HEV. As one example, battery measurement signals may be transferred between battery packs of the HEV operating in a first voltage domain (e.g., voltages greater than about 100V) and battery management systems of the HEV operating in a second voltage domain (e.g., voltages less than about 10V) that is different from the first voltage domain for controlling charging and discharging of the battery packs. The battery packs can be used to drive an electric motor and other components of the HEV.

SUMMARY

Described herein are concepts, systems, circuits and techniques related to signal isolator integrated circuit (IC) packages and isolation barriers of signal isolator IC packages including an insulator (or insulating layers) with an improved time dependent dielectric breakdown (TDDB), for example. More particularly, in one aspect, a signal isolator IC package according to the disclosure includes a first die in a first voltage domain and a second die in a second voltage domain. The signal isolator IC package also includes a first signal path from the first die to the second die via a first isolation barrier supported by the first die. The first isolation barrier includes a first conductive layer disposed over a surface of the first die and a first insulating layer disposed over the first conductive layer. The first isolation barrier also includes a second insulating layer disposed over the first insulating layer and a second conductive layer disposed over the second insulating layer. A first floating conductive plate is disposed between the first insulating layer and the second insulating layer. In embodiments, the first die of the IC package supports circuitry configured to operate in the first voltage domain and the second die of the IC package supports circuitry configured to operate in the second voltage domain. The isolation barrier may separate the first and second voltage domains, which may be different from each other, for example, including different source potentials and different grounds. Additionally, the isolation barrier can maintain galvanic isolation between the first and second voltage domains and the first and second die.

The IC package may include one or more of the following features individually or in combination with other features. At least one edge of the first floating conductive plate may extend beyond an edge of the first conductive layer to increase evenness of electric charge distribution. The first insulating layer and the second insulating layer may each have a respective thickness. The thickness of at least one of the first insulating layer and the second insulating layer may be selected to provide a first predetermined level of signal isolation between the first die and the second die. The first insulating layer and the second insulating layer may have a substantially similar thickness.

At least one of the first insulating layer and the second insulating layer may include a plurality of layers including one or more insulating materials. The first conductive layer and the second conductive layer may each have a respective thickness. The thickness of at least one of the first conductive layer and the second conductive layer may be selected to provide a first predetermined level of signal isolation between the first die and the second die. The first floating conductive plate may be spaced substantially equidistant from the first conductive layer and the second conductive layer. The first signal path may include one or more wirebonds.

The second die may have a first die area in the second voltage domain and a second die area in a third voltage domain. The IC package may include a second signal path from the first die area of the second die to the second die area of the second die via a second isolation barrier supported by the second die. The second isolation barrier may include a third conductive layer disposed over a surface of the second die and a third insulating layer disposed over the third conductive layer. The second isolation barrier may also include a fourth conductive layer disposed over the third insulating layer. The second isolation barrier may include a second floating conductive plate disposed between the third insulating layer and the fourth conductive layer and a fourth insulating layer disposed between the second floating conductive plate and the fourth conductive layer.

The third insulating layer and the fourth insulating layer of the second isolation barrier may each have a respective thickness. The thickness of at least one of the third insulating layer and the fourth insulating layer may be selected to provide a second predetermined level of signal isolation between the first die area and the second die area. The second floating conductive plate of the second isolation barrier may be spaced substantially equidistant from the third conductive layer and the fourth conductive layer. The third conductive layer and the fourth conductive layer of the second isolation barrier may each have a respective thickness. The thickness of at least one of the third conductive layer and the fourth conductive layer may be selected to provide a second predetermined level of signal isolation between the first die area and the second die area.

In another aspect of the concepts described herein, a signal isolator IC package includes a first die having a first die area in a first voltage domain and a second die area in a second voltage domain. The first die area and second die area are galvanically isolated. The IC package also includes a signal path from the first die area of the first die to the second die area of the first die via a first isolation barrier supporter by the first die. The first isolation barrier includes a first conductive layer disposed over a surface of the first die and a first insulating layer disposed over the first conductive layer. The isolation barrier also includes a second insulating layer disposed over the first insulating layer and a second conductive layer disposed over the second insulating layer. A first floating conductive plate is disposed between the first insulating layer and the second insulating layer.

In embodiments, at least one edge of the first floating conductive plate extends beyond an edge of the first conductive layer to increase evenness of electric charge distribution. Additionally, in embodiments the first insulating layer and the second insulating layer each have a respective thickness. The thickness of at least one of the first insulating layer and the second insulating layer may be selected to provide a first predetermined level of signal isolation between the first die area and the second die area. In embodiments, the first conductive layer and the second conductive layer each have a respective thickness. The thickness of at least one of the first conductive layer and the second conductive layer may be selected to provide the first predetermined level of signal isolation between the first die area and the second die area. In embodiments, the floating conductive plate may be spaced substantially equidistant from the first conductive layer and the second conductive layer.

In embodiments, the IC package includes a second die in a third voltage domain. The first and second die may be galvanically isolated. In embodiments, the IC package includes a second signal path from the second die area of the first die to the second die via a second isolation barrier supported by one of the first die and the second die. The second isolation barrier may include a third conductive layer disposed over a surface of the second die, a third insulating layer disposed over the third conductive layer, and a fourth insulating layer disposed over the third insulating layer. Additionally, the second isolation barrier may include a fourth conductive layer disposed over the fourth insulating layer and a second floating conductive plate disposed between the third insulating layer and the fourth insulating layer. In embodiments, the third insulating layer and the fourth insulating layer of the second isolation barrier each have a respective thickness. In embodiments, the thickness of at least one of the third insulating layer and the fourth insulating layer may be selected to provide a second predetermined level of signal isolation between the first die area and the second die area.

The above and below described signal isolator IC packages and isolation barriers of signal isolator IC packages according to the disclosure have been found to provide for an insulator (or insulating layers) of the isolation barriers having an improved time dependent dielectric breakdown (TDDB) in comparison to conventional capacitive signal isolator IC packages, for example. In embodiments, the foregoing is due to the floating conductive plates of the isolation barriers according to the disclosure distributing electric fields in the insulator more evenly, thereby reducing points of high electric field in the insulator which could initiate breakdown of the insulator. More particularly, the floating conductive plates of the isolation barriers, which are disposed between conductive layers of the isolation barriers, have been shown to improve the TDDB of the isolation barrier insulator for withstanding relatively high voltages over extended periods of time. It is believed that the floating conductive plates may enable the isolation barrier insulator to withstand hundreds of volts for twenty years or more, for example. As is known in the art, insulating materials or layers (e.g., dielectric layers) tend to breakdown when subjected to high voltages for extended periods of time. In other words, insulating materials or layers generally have an associated TDDB.

In embodiments, by increasing the TDDB of the isolation barrier insulator, the lifetime of the signal isolator IC packages may be increased, which may substantially reduce (or ideally eliminate) the need to replace signal isolator IC packages (or components of the IC packages) in systems in which the IC packages are provided. The foregoing may, for example, reduce waste as well as timely and costly repairs. In other words, ideally IC packages accordingly to the disclosure will outlast the lifetime (i.e., product lifetime) of the systems in which the IC packages are provided.

In embodiments, the various arrangements of floating conductive plates as described herein may be found particularly suitable in high voltage isolation integrated circuits such as digital isolators, analog isolators, current sensors or other devices needing a high voltage standoff insulation for signal transmission or sensing. Additionally, in embodiments the above and below described signal isolator IC packages may be found suitable for use in a variety of applications. For example, the IC packages may be found suitable for use in HEV applications and various energy harvesting applications such as solar energy harvesting.

In contrast to known prior art, isolation barriers of signal isolator IC packages according to the disclosure are provided on semiconductor die of the IC packages versus being used in other types of substrate (e.g., substrate outside of the IC packages). Example benefits of IC based isolators include the ability to integrate additional functionality, e.g., gate drivers, into an IC package and the increased integration possibilities of such an IC package. Other examples of signal isolators include pulse transformers and opto-couplers. Conventional pulse transformers generally comprise standalone passive components. Additionally, conventional opto-couplers generally do not have inherent integration capabilities.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
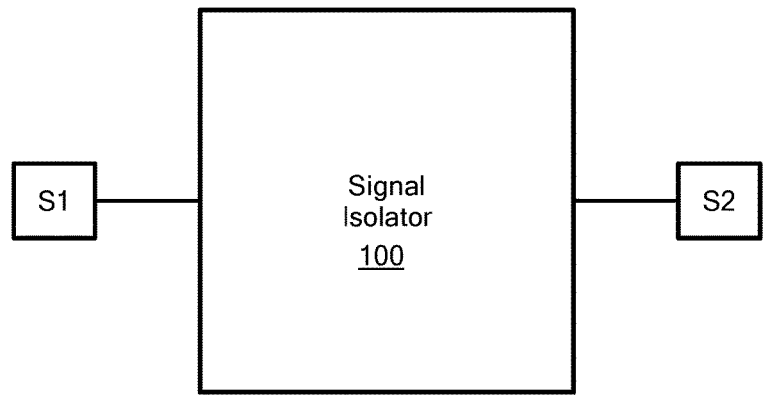
FIG. 1 is a block diagram of an example signal isolator coupled to systems that may want to communicate with each other.

Referring to FIG. 1, an example signal isolator 100 in accordance with an embodiment of the disclosure is shown coupled to a first system S1 and to a second system S2. In embodiments, the first system S1 is configured to operate in a first voltage domain (e.g., voltages greater than about 100V). Additionally, in embodiments, the second system S2 is configured to operate in a second voltage domain (e.g., voltages less than about 10V) that is substantially different from the first voltage domain. The first and second voltage domains may include different source potentials and different grounds, for example.

In embodiments, the signal isolator 100 may provide a communication path between the first system S1 and the second system S2. In particular, the signal isolator 100 may receive signals from the first system S1 and provide the signals to the second system S2. Additionally, the signal isolator 100 may receive signals from the second system S2 and provide the signals to the first system S1. In embodiments, the signal isolator 100 may also be configured to provide signal isolation between the first system S1 and the second system S2, preventing communication of voltages from one domain to the other and protecting lower voltage circuitry of the first system S1 or the second system S2 from higher voltage signals which can damage the lower voltage circuitry, for example.

Figure 2:
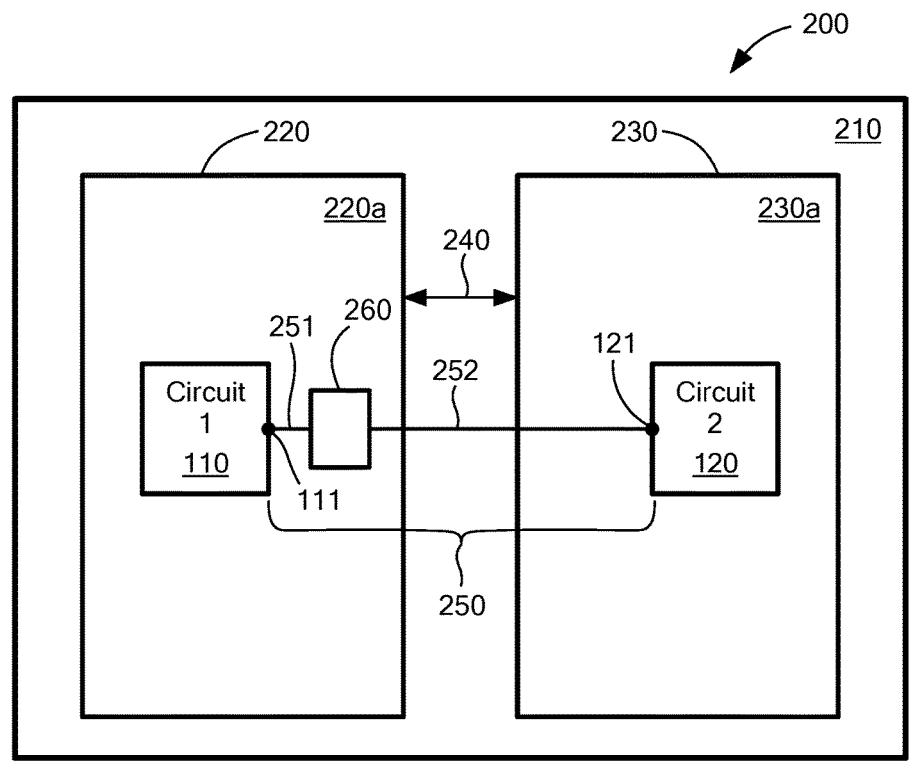
FIG. 2 is a block diagram of an example signal isolator integrated circuit (IC) package in accordance with embodiments of the disclosure.

Referring now to FIG. 2, an example signal isolator 200 that forms part of a signal isolator integrated circuit (IC) package 210 is shown. The IC package 210 includes a first die 220 and a second die 230. The IC package 210 also includes a signal path 250 from the first die 220 to the second die 230. In the example embodiment shown, the signal path 250 includes a first electrical connection 251, a second electrical connection 252 and an isolation barrier 260. Additionally, in the example embodiment shown, the signal path 250 extends from the first die 220 to the second die 230 across a spacing 240 between the first and second die 220, 230. The spacing 240 corresponds to a predetermined distance or region between the first and second die 220, 230. In embodiments, the spacing 240 (in conjunction with isolation barrier 260 and/or other isolation means) provides galvanic isolation between the first and second die 220, 230. It is understood that any suitable technique can be used to provide galvanic isolation between the first and second die 220, 230.

In the illustrated embodiment, the isolation barrier 260 and a first circuit 110 (e.g., a first transmitter/receiver circuit) are each supported by a respective surface 220a (e.g., an active surface) of the first die 220. Additionally, a second circuit 120 (e.g., a second transmitter/receiver circuit) is supported by a respective surface 230a (e.g., an active surface) of the second die 230. A terminal 111 (e.g., an input/output (I/O) terminal) of the first circuit 110 is coupled to a first portion of the isolation barrier 260 through first electrical connection 251 of the signal path 250. Additionally, a terminal 121 (e.g., an I/O terminal) of the second circuit 120 is coupled to a second opposing portion of the isolation barrier 260 through second electrical connection 252 of the signal path 250.

In embodiments, the first circuit 110 and the first die 220 operate in a first voltage domain and the second circuit 120 and the second die 230 operate in a second voltage domain that is substantially different from the first voltage domain. Additionally, in embodiments separate voltage supply signals and ground connections can be provided to each of the first and second dies 220, 230 of the IC package 210 to support the respective first and second voltage domains from which the first and second circuits 110, 120, and the first and second die 220, 230, may operate in. For example, in embodiments the first die 220 is coupled to a first supply voltage in the first voltage domain and the second die 230 is coupled to a second supply voltage in the second voltage domain. In embodiments, a voltage differential between the first and second voltage domains can range from about zero volts to thousands of volts.

With the above-described arrangement of IC package 210, an output signal (e.g., a digital or analog signal) of the first circuit 110 can be received by the second circuit 120 with signal isolation via isolation barrier 260. Additionally, with the above-described arrangement of IC package 210, an output signal of the second circuit 120 can be received by the first circuit 110 with signal isolation via isolation barrier 260. In other words, the isolation barrier 260 may be used to pass signals between first and second voltage domains in which the first and second circuits 110, 120, and the first and second die 220, 230, may operate. The first circuit 110 may process signals received from the second circuit 120. Additionally, the second circuit 120 may process signals received from the first circuit 110.

In embodiments in which the IC package 210 is used for communication of digital signals and the first and second circuits 110, 120 operate in first and second respective voltage domains, for example, the isolation barrier 260 may be coupled to receive signals from the first circuit 110 having one of two binary voltage levels referenced to a ground voltage of the first voltage domain via electrical connection 251 of the signal path 250. Additionally, the isolation barrier 260 may be configured to allow transfer of signals to the second circuit 120 via electrical connection 252 of the signal path 250, with the second circuit 120 referencing the received signals to a ground voltage of the second voltage domain. In embodiments, the isolation barrier 260, which corresponds to an isolation barrier according to the disclosure, may transfer the signals using capacitive coupling techniques, for example.

More detailed descriptions of isolation barriers according to the disclosure are discussed in connection with figures below. However, let it suffice here to say that isolation barriers according to the disclosure (e.g., 360, shown in FIG. 3, as will be discussed) include a plurality of isolation layers which are stacked substantially vertically, perpendicular to a surface (e.g., an active surface) of the die(s) on which the isolations barriers are supported. In the illustrated embodiment, for example, isolation barrier 260 may include a plurality of isolation layers which are disposed over and stacked on surface 220a of first die 220.

It is understood that a wide range of signal types can be transmitted between the first die 220 and the second die 230 via isolation barrier 260 without departing from the scope of the disclosure. Additionally, it is understood that a wide range of techniques can be used for transmitting signals between the first die 220 and the second die 230 via isolation batter 260 without departing from the scope of the disclosure. In embodiments, signals may be transferred between the first die 220 and the second die 230 using on-off keying techniques, for example.

It is also understood that while the second circuit 120 is shown as supported by a different die from the first circuit 110 in the illustrated embodiment, in embodiments the second circuit 120 may be supported by a same die as the first circuit 110, as will be described further below in connection with FIG. 6, for example. In embodiments, at least one of the first and second die 220, 230 can support diagnostic circuitry which may be used to determine if signals are transferring correctly between the first and second circuits 110, 120. It is understood that any practical number of circuits can be formed on the first and/or second die 220, 230 to meet the needs of a particular application.

More detailed aspects of signal isolator IC packages, with a particular focus on isolation barriers of IC package signal paths according to the disclosure, are described in connection with figures below.

Figure 3:
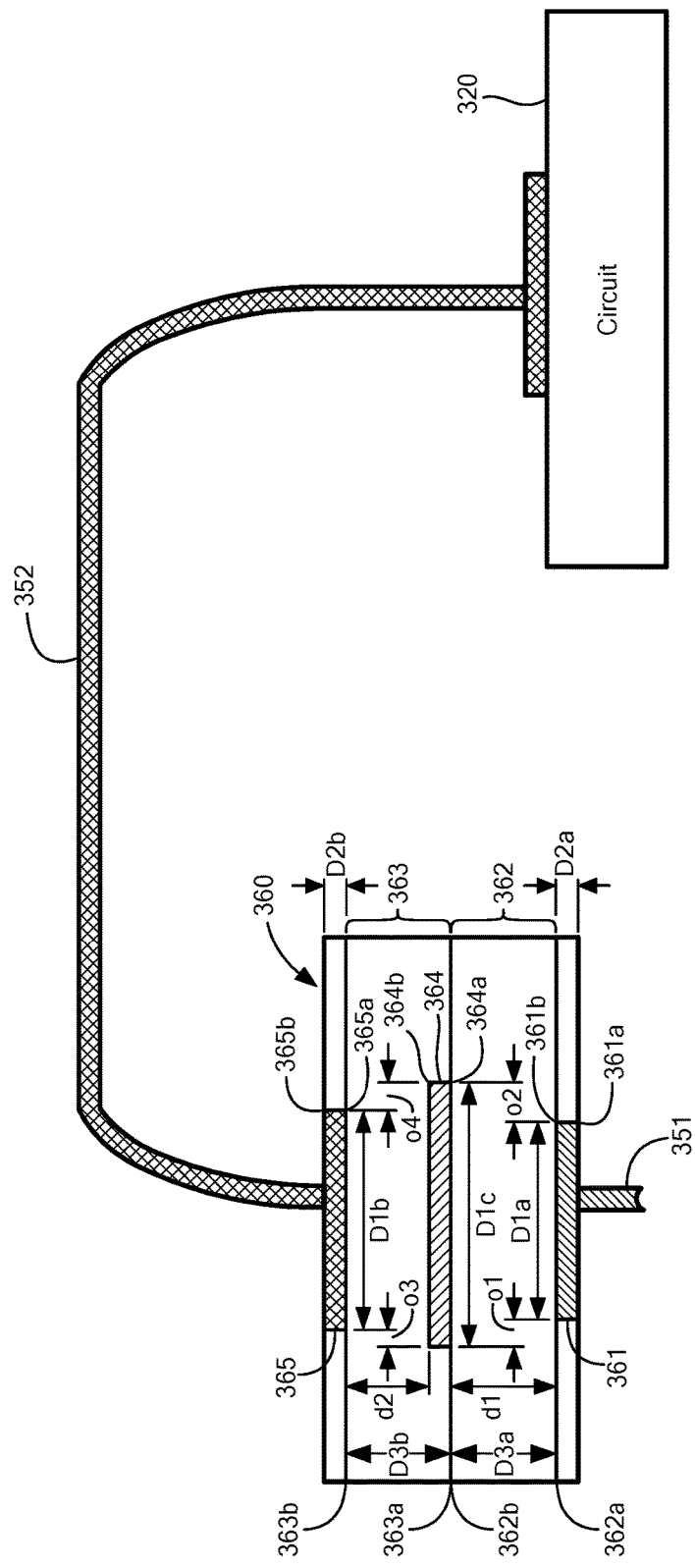
FIG. 3 shows a cross-section of an example isolation barrier of a signal isolator IC package in accordance with embodiments of the disclosure.

Referring now to FIG. 3, a cross-section of an example isolation barrier 360 of an IC package signal path according to the disclosure is shown. The isolation barrier 360 is coupled to a circuit 320 through an electrical connection 352 of the signal path. In embodiments, the isolation barrier 360 is supported by a first respective die of a signal isolator IC package (e.g., 210, shown in FIG. 2). Additionally, in embodiments the circuit 320 is a circuit supported by a second respective die in the IC package. Similar to isolation barrier 260 of FIG. 2, in embodiments the isolation barrier 360 can be used to transmit or communicate signals between the first and second die using capacitive coupling techniques, for example. Additionally, in embodiments the isolation barrier 360 can be used to provide a predetermined level of signal isolation between the first and second die. The first and second die, and circuits supported by the first and second die, can operate in first and second different respective voltage domains.

Referring in closer detail to FIG. 3, the isolation barrier 360 includes a plurality of conductive layers (here, conductive layers 361, 365), a plurality of insulating layers (here, insulating layers 362, 363), and at least one floating conductive plate (here, a floating conductive plate 364). In the example embodiment shown, a first one of the insulating layers (also sometimes referred to herein as a "first insulating layer") 362 is disposed over a first one of the conductive layers (also sometimes referred to herein as a "first conductive layer") 361. Additionally, a second one of the insulating layers (also sometimes referred to herein as a "second insulating layer") 363 is disposed over the first insulating layer 362 and a second one of the conductive layers (also sometimes referred to herein as a "second conductive layer") 365 is disposed over the second insulating layer 363. Further, the floating conductive plate 364 is disposed between the first insulating layer 362 and the second insulating layer 363. In the example embodiment shown, floating conductive plate 364 is not directly coupled to either first conductive layer 361 or second conductive layer 365, i.e., floating conductive plate 364 is "floating."

In some embodiments, the first conductive layer 361 is disposed over a surface (e.g., an active surface) of a first die supporting the isolation barrier 360. Additionally, in embodiments the conductive layers 361, 365, insulating layers 362, 363, and floating conductive plate 364 (collectively, isolation layers) are each stacked vertically, substantially perpendicular to the die surface.

In the illustrated embodiment, first conductive layer 361 of isolation barrier 360 is coupled to an electrical connection 351 of the signal path including the isolation barrier 360. In embodiments, the electrical connection 351 is coupled to a circuit (e.g., 110, shown in FIG. 2) which is supported by a same die as the isolation barrier 360. Additionally, second conductive layer 365 of isolation barrier 360 is coupled to electrical connection 352 of the signal path. In embodiments, at least one of electrical connection 351 and electrical connection 352 may include or be provided as a wirebond.

In the example embodiment shown, the conductive layers 361, 365 and the floating conductive plate 364 each have a respective length and width. Additionally, the conductive layers 361, 365 and the floating conductive plate 364 each have a first major surface (e.g., 361a, 365a, 364a) and a second opposing major surface (e.g., 361b, 365b, 364b). The second major surface may be parallel, or parallel within manufacturing tolerances, to the respective first major surface. A first dimension D1a across first major surface 361a (e.g., a major axis of the first major surface 361a) of first conductive layer 361 may correspond to a length of the first conductive layer 361 and a second dimension across the first major surface 361a (e.g., a minor axis of the first major surface 361a) may correspond to a width of the first conductive layer 361. Additionally, a first dimension D1b across a first major surface 365a of second conductive layer 365 may correspond to a length of the second conductive layer 365 and a second dimension across the first major surface 365a may correspond to a width of the second conductive layer 365. Further, a first dimension D1c across a first major surface 364a of the floating conductive plate 364 may correspond to a length of the floating conductive plate 364 and a second dimension across the first major surface 364a may correspond to a width of the floating conductive plate 364.

In some embodiments, the length and width dimensions of the conductive layers 361, 365 are substantially the same. For example, in one embodiment the length and width dimensions of the conductive layers 361, 365 may be about 30 micrometers (μm) by about 30 μm. In another embodiment, the length and width dimensions of the conductive layers 361, 365 may be about 100 μm by about 100 μm. In other embodiments, the length and width dimensions of the conductive layers 361, 365 are substantially different from each other.

In the example embodiment shown, the conductive layers 361, 365 each also have a respective thickness. A distance D2a between the first major surface 361a of first conductive layer 361 and the second major surface 361b of first conductive layer 361 may correspond to a thickness of the first conductive layer 361. Additionally, a distance D2b between the first major surface 365a of second conductive layer 365 and the second major surface 365b of second conductive layer 365 may correspond to a thickness of the second conductive layer 365.

Additionally, in the example embodiment shown, each of the insulating layers 362, 363 has a respective thickness. Each of the insulating layers 362, 363 also has a first major surface (e.g., 362a, 362b) and a second opposing major surface (e.g., 362b, 363b). A distance D3a between the first major surface 362a of first insulating layer 362 and the second major surface 362b of first insulating layer 362 may correspond to a thickness of the first insulating layer 362. Additionally, a distance D3b between the first major surface 363a of second insulating layer 363 and the second major surface 363b of second insulating layer 363 may correspond to a thickness of the second insulating layer 363.

In embodiments, the above-described thickness dimension of at least one of the conductive layers 361, 365, for example, is selected to provide a predetermined level of signal isolation between the first die (or die area) supporting the isolation barrier 360 and the second die (or die area) supporting the circuit 320. For example, the thickness dimension of first conductive layer 361 may be selected to have a first dimension in some embodiments to provide a first predetermined level of signal isolation between the first die and the second die. In some embodiments, the first and second dies may be different dies (e.g., a first die 220 and a second die 230), as discussed above in connection with FIG. 2. Additionally, in some embodiments the first and second dies may be a same die, as will be discussed further below in connection with FIG. 6.

The thickness dimension of the first conductive layer 361 may also be selected to have a second dimension which is greater than the first dimension in some embodiments to provide a second predetermined level of signal isolation that is greater than the first predetermined level of signal isolation. In embodiments, the predetermined level of signal isolation corresponds to the TDDB of the insulating layers 362, 363 disposed between the conductive layers 361, 365. For example, an increase in the predetermined level of signal isolation (i.e., isolation capacity) may correspond to an increase in breakdown voltage of the insulating layers 362, 363.

Additionally, in embodiments the above-described thickness dimension of at least one of the insulating layers 362, 363 is selected to provide the predetermined level of signal isolation between the first die and the second die. For example, first insulating layer 362 may have a first thickness selected to provide a first predetermined level of signal isolation between the first die and the second die in some embodiments. Additionally, first insulating layer 362 may have a second thickness selected to provide a second predetermined level of signal isolation that is substantially greater than the first predetermined level of signal isolation in some embodiments. In some embodiments, an increase in the thickness of at least one of the insulating layers 362, 363 results in a corresponding increase (e.g., a substantially linear increase) in the predetermined level of signal isolation. In some embodiments, the first insulating layer 362 and the second insulating layer 363 have a substantially similar thickness. For example, in embodiments the insulating layers 362, 363 are each relatively "thin" layers having a thickness of between a few micrometers to tens of microns.

In general, it has been found that dimensions (e.g., thickness) of the insulating layers 362, 363 and conductive layers 361, 365 can affect the predetermined level of signal isolation provided by isolation barrier 360 between the first die and the second die. In embodiments, materials of the insulating layers 362, 363 and conductive layers 361, 365 can also affect the predetermined level of signal isolation. In embodiments, the dielectric breakdown voltage of each material can be different and may be a function of the thickness of the material. For example, Polyimide (PI) can have a dielectric breakdown voltage in a range of 350 volts/micron and Silicon Dioxide ($SiO_2$) can have a dielectric breakdown voltage in a range of about 500 volts/micron. In the illustrated embodiment, the conductive layers 361, 365 each include one or more electrically conductive materials (e.g., Copper (Cu), conductive Silicon (S1), etc.). Additionally, the insulating layers 362, 363 each include one or more electrically insulating materials (e.g., Silicon Dioxide ($SiO_2$). In some embodiments, the first conductive layer 361 may be the same as or similar to the second insulating layer 365 (e.g., comprise same materials and have same dimensions). Additionally, in some embodiments the first insulating layer 362 may be the same as or similar to the second insulating layer 363.

It has also been found that dimensions (e.g., thickness) of the floating conductive plate 364 can affect the evenness of electric charge distribution between the conductive layers 361, 365. In particular, it has been found that evenness of electric charge distribution between the conductive layers 361, 365 is increased in embodiments in which at least one edge of the floating conductive plate 364 extends beyond an edge of at least one of the first conductive layer 361 and the second conductive layer 365. In embodiments, by the at least one edge of the floating conductive plate 364 extending beyond an edge of at least one edge of the first conductive layer 364 and the second conductive layer 365, the floating conductive plate 364 may reduce variability of capacitive coupling of fringing electric fields at edges of the first conductive layer 361 and/or the second conductive layer 365. This is in contrast to conventional parallel plate/layer configurations in which electrical field strength is generally largest at edges of the plates, resulting in substantially uneven electric charge distribution between the plates.

In the illustrated embodiment, the floating conductive plate 364 has a length dimension $D1c$ that is greater than a length dimension $D1a$ of the first conductive layer 361, resulting in a first offset o1 between a first edge of the first conductive layer 361 and a first edge of the floating conductive plate 364 and a second offset o2 between a second edge of the first conductive layer 361 and a second edge of the floating conductive plate 364. Additionally, in the illustrated embodiment the floating conductive plate 364 has a length dimension $D1c$ that is greater than a length dimension $D1b$ of the second conductive layer 365, resulting in a third offset o3 between a first edge of the second conductive layer 365 and the first edge of the floating conductive plate 364 and a fourth offset o4 between a second edge of the second conductive layer 365 and the second edge of the floating conductive plate 364. In embodiments in which the first conductive layer 361 has a same length dimension as the second conductive layer 365, the first offset o1 may be the same as the third offset o3 and the second offset o2 may be the same as the fourth offset o4. In embodiments, the offsets (i.e., geometrical or alignment variations) occur due to normal process variations.

In some embodiments, insulating layers 362, 363, conductive layers 361, 365 and floating conductive plate 364 may have substantially any geometry, for example, depending upon the particular application in which the isolation barrier 360 and the signal isolator IC package including the isolation barrier 360 are being used and a desired level of signal isolation.

It has further been found that spacings between the conductive layers 361, 365 and the floating conductive plate 364 can affect the predetermined level of signal isolation provided by isolation barrier 360 between the first die and the second die.

In the example embodiment shown, the conductive layers 361, 365 are each spaced apart from the floating conductive plate 364 by respective distances. In particular, the first conductive layer 361 is spaced apart from the floating conductive plate 364 by a first predetermined distance d1 (here, a same distance as a thickness dimension $D3a$ of insulating layer 362). Additionally, the second conductive plate 365 is spaced apart from the floating conductive plate 364 by a second predetermined distance d2. In embodiments, at least one of the first predetermined distance d1 and the second predetermined distance d2 is selected to provide the predetermined level of signal isolation between the first die and the second die. For example, in one embodiment the first predetermined distance d1 may be selected to provide a first predetermined level of signal isolation. Increasing the first predetermined distance d1 to a distance greater than the first predetermined distance may result in the signal isolation being increased to a level greater than the first predetermined level of signal isolation. In some embodiments the first predetermined distance d1 is substantially the same as the second predetermined distance d2 and floating conductive plate 364 is spaced substantially equidistant from the first conductive layer 361 and the second conductive layer 365.

In embodiments, by disposing the floating conductive plate 364 between the first insulating layer 362 and the second insulating layer 363, the floating conductive plate 364 is able to more uniformly distribute electric fields across the isolation barrier 360 (e.g., between conductive layers 361, 365) through capacitive coupling, for example, in response to the isolation barrier 360 receiving signals from electrical connection 351 and/or electrical connection 352. Additionally, the floating conductive plate 364 is able to substantially reduce localized high electric field spots within the signal isolator IC package. Due to the foregoing, the floating conductive plate 364 may be found to increase the lifetime (and TDDB) of the first insulating layer 362 and the second insulating layer 363, for example, in embodiments in which the first insulating layer 362 and the second insulating layer 363 are subjected to relatively high voltages (e.g., voltages greater than about 100V) for extended periods of time (e.g., hours, days, months or years). The relatively high voltages and associated extended periods of time may vary based upon the application in which isolation barrier 360, and the IC package including isolation barrier 360, are used. In embodiments, signals are transferred between conductive layers 361, 365 of the isolation barrier 360 as changes in electrical fields across the conductive layers 361, 365. In some embodiments, the signal amplitude can be orders of magnitude lower than the isolation voltage.

Figure 3A:
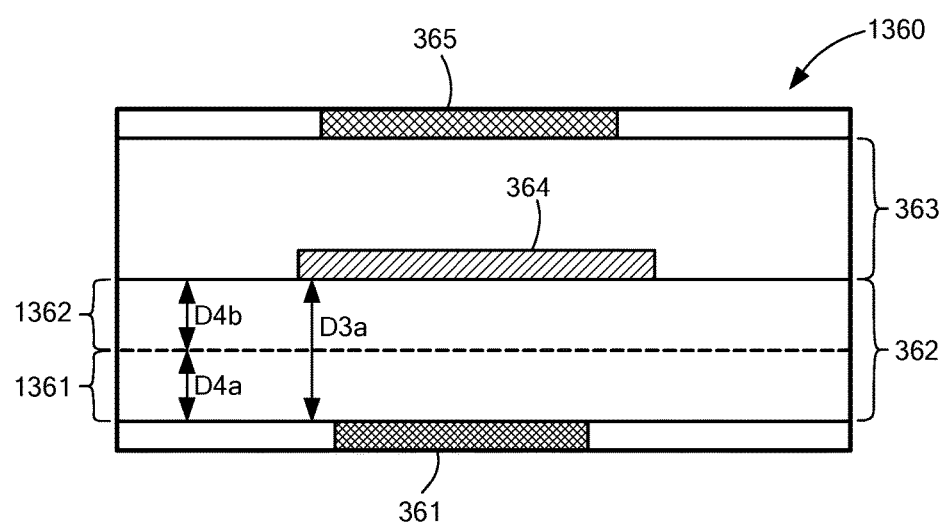
FIG. 3A shows a cross-section of another example isolation barrier of a signal isolator IC package in accordance with embodiments of the disclosure.

Referring now to FIG. 3A, in which like elements of FIG. 3 are shown having like reference designations, another example isolation barrier 1360 includes the first conductive layer 361, the first insulating layer 362, the second insulating layer 363, the floating conductive plate 364 and the second conductive layer 365. The first insulating layer 362 includes two layers (or sub-layers) 1361, 1362 in the illustrated embodiment. In embodiments, layers 1361, 1362 each have a respective thickness (here, D4a, D4b, respectively) and include one or more respective insulating materials. In some embodiments, layer 1361 has a same or similar thickness as layer 1362. Additionally, in some embodiments, layer 1361 includes one or more same or similar insulating materials (e.g., SiO$_2$) as layer 1362. Layer 1361 may also include one or more different types of insulating materials in some embodiments. Each of the insulating materials can have different properties (e.g., insulating properties). By having different types of insulators, multiple benefits (e.g., increased isolation capabilities) can be realized. It is understood that the second insulating layer 363 may also include a plurality of layers in some embodiments.

Figure 4:
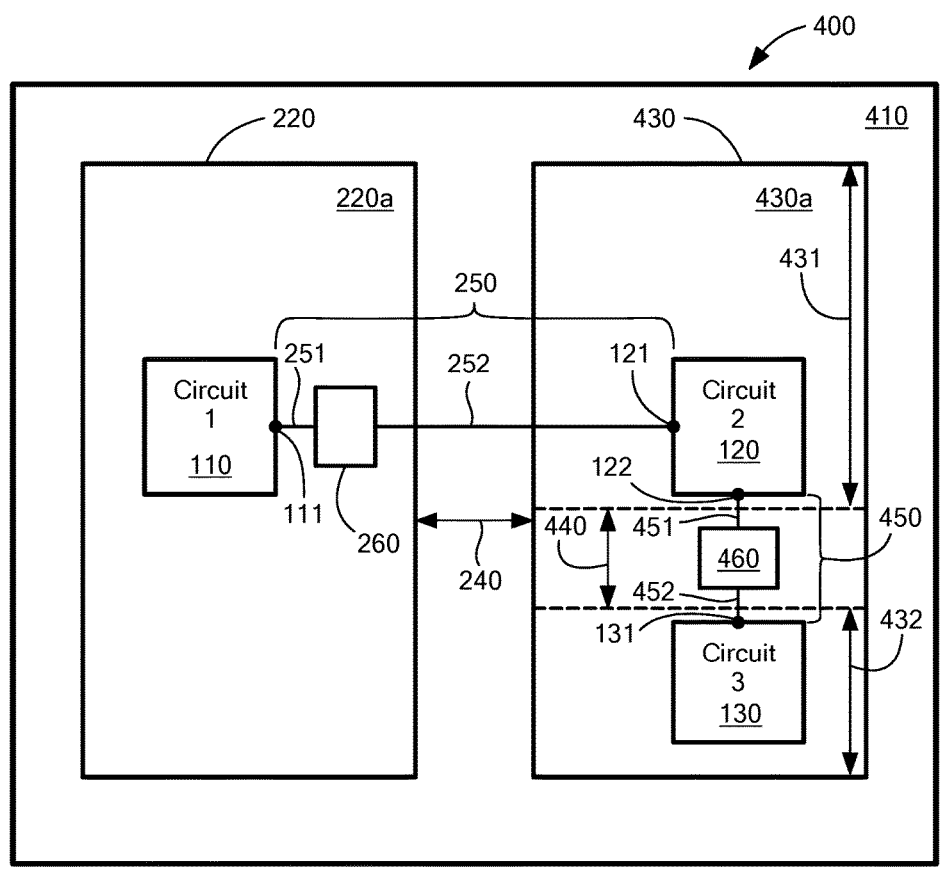
FIG. 4 is a block diagram of another example signal isolator IC package in accordance with embodiments of the disclosure.

Referring now to FIG. 4, in which like elements of FIG. 2 are shown having like reference designations, another example signal isolator 400 that forms part of a signal isolator IC package 410 is shown. The IC package 410 includes a first die 220 and a second die 430. The second die 430 includes a first die area 431 and a second die area 432. The first die area 431 is spaced apart from the second die area 432 by a spacing 440. In embodiments, spacing 440, similar to spacing 240, may provide galvanic isolation between the first and second die 220, 230 (in conjunction with isolation barrier 460, as will be discussed below, and/or other isolation means).

In the illustrated embodiment, the IC package 410 also includes a signal path 250 (here, a first signal path 250) from the first die 220 to the first die area 431 of the second die 430. Additionally, in the illustrated embodiment the IC package 410 includes a second signal path 450 from the first die area 431 of the second die 430 to the second die area 432 of the second die 430. First signal path 250 includes first electrical connection 251, second electrical connection 252 and isolation barrier 260 (here, a first isolation barrier 260). Additionally, second signal path 450 includes a third electrical connection 451, a fourth electrical connection 452 and a second isolation barrier 460.

In the illustrated embodiment, first isolation barrier 260 and first circuit 110 are each supported by surface 220a of the first die 220. Additionally, in the illustrated embodiment second isolation barrier 460, second circuit 120 and a third circuit 130 are each supported by a respective surface 430a (e.g., an active surface) of the second die 430. More particularly, the second circuit 120 is supported by a selected portion of surface 430a on the first die area 431 of second die 430 and the third circuit 130 is supported by a selected portion of surface 430a on the second die area 432 of second die 430.

Terminal 111 of the first circuit 110 is coupled to the first portion of the first isolation barrier 260 through first electrical connection 251 of the first signal path 250 and terminal 121 of the second circuit 120 is coupled to the second portion of the first isolation barrier 260 through second electrical connection 252 of the first signal path 250. Additionally, a terminal 122 (e.g., an I/O terminal) of the second circuit 120 is coupled to a first portion of the second isolation barrier 460 through third electrical connection 451 of the second signal path 450. Further, a terminal 131 of the third circuit 130 is coupled to a second opposing portion of the second isolation barrier 460 through fourth electrical connection 452 of the second signal path 450.

In embodiments, the first circuit 110 and the first die 220 operate in a first voltage domain and the second circuit 120 and the first die area 431 of the second die 430 operate in a second voltage domain that is substantially different from the first voltage domain. Additionally, in embodiments the third circuit 130 and the second die area 432 of the second die 430 operate in a third voltage domain. In some embodiments, the third voltage domain is substantially the same as the first voltage domain, for example. Additionally, in some embodiments the third voltage domain is substantially different from both the first voltage domain and the second voltage domain. In embodiments, separate voltage supply signals and ground connections can be provided to each of the first and second dies 220, 430 of the IC package 410 to support the respective first, second and third voltage domains from which the first, second and third circuits 110, 120, 130, and the first die 220 and first and second die areas 431, 432, may operate. For example, in embodiments the first die 220 is coupled to a first supply voltage in the first voltage domain and the second die 230 is coupled to second and third supply voltage in second and third respective voltage domains.

With the above-described arrangement of IC package 410, an output signal (e.g., a digital or analog signal) of the first circuit 110 can be received by the second circuit 120 with signal isolation via first isolation barrier 260. Additionally, with the above-described arrangement of IC package 410, an output signal of the second circuit 120 can be received by the first circuit 110 with signal isolation via first isolation barrier 260.

Additionally, with the above-described arrangement of IC package 410, an output signal of the second circuit 120 can be received by the third circuit 130 with signal isolation via second isolation barrier 460. Additionally, with the above-described arrangement of IC package 410, an output signal of the third circuit 130 can be received by the second circuit 120 with signal isolation via second isolation barrier 460.

In embodiments in which the third circuit 130 and the second die area 431 of the second die 430 operate in a voltage domain (e.g., a third voltage domain) that is the same as or similar to a voltage domain (e.g., a first voltage domain) in which the first circuit 110 and the first die 220 operate, second isolation barrier 460 may be substantially the same as the first isolation barrier 260. Additionally, in embodiments in which the third circuit 130 and the second die area 431 of the second die 430 operate in a voltage domain that is different from a voltage domain in which the first circuit 110 and the first die 220 operate, second isolation barrier 460 may be substantially similar to first isolation barrier 260 in that both second isolation barrier 460 and first isolation barrier 260 include a plurality of isolating layers (i.e., conductive layers, insulating layers, and at least one floating conductive plate). However, second isolation barrier 460 may comprise one or more characteristics (e.g., layer dimensions, layer materials, etc.) which are different from corresponding characteristics of the first isolation barrier 460.

As discussed in figures above, it has been found that dimensions (e.g., thickness) of insulating layers and conductive layers of an isolation barrier according to the disclosure, for example, can affect a predetermined level of signal isolation provided by the isolation barrier. In the example embodiment shown, the first isolation barrier 260 can provide a first predetermined level of signal isolation between the first die 220 and the second die 430. Additionally, the second isolation barrier 460 can provide a second predetermined level of signal isolation between the first and second die areas 431, 432 of the second die 430. In some embodiments, the first predetermined level of signal isolation may be substantially the same as the second predetermined level of signal isolation. Additionally, in some embodiments the first predetermined level of signal isolation may be substantially different from the second predetermined level of signal isolation.

Figure 5:
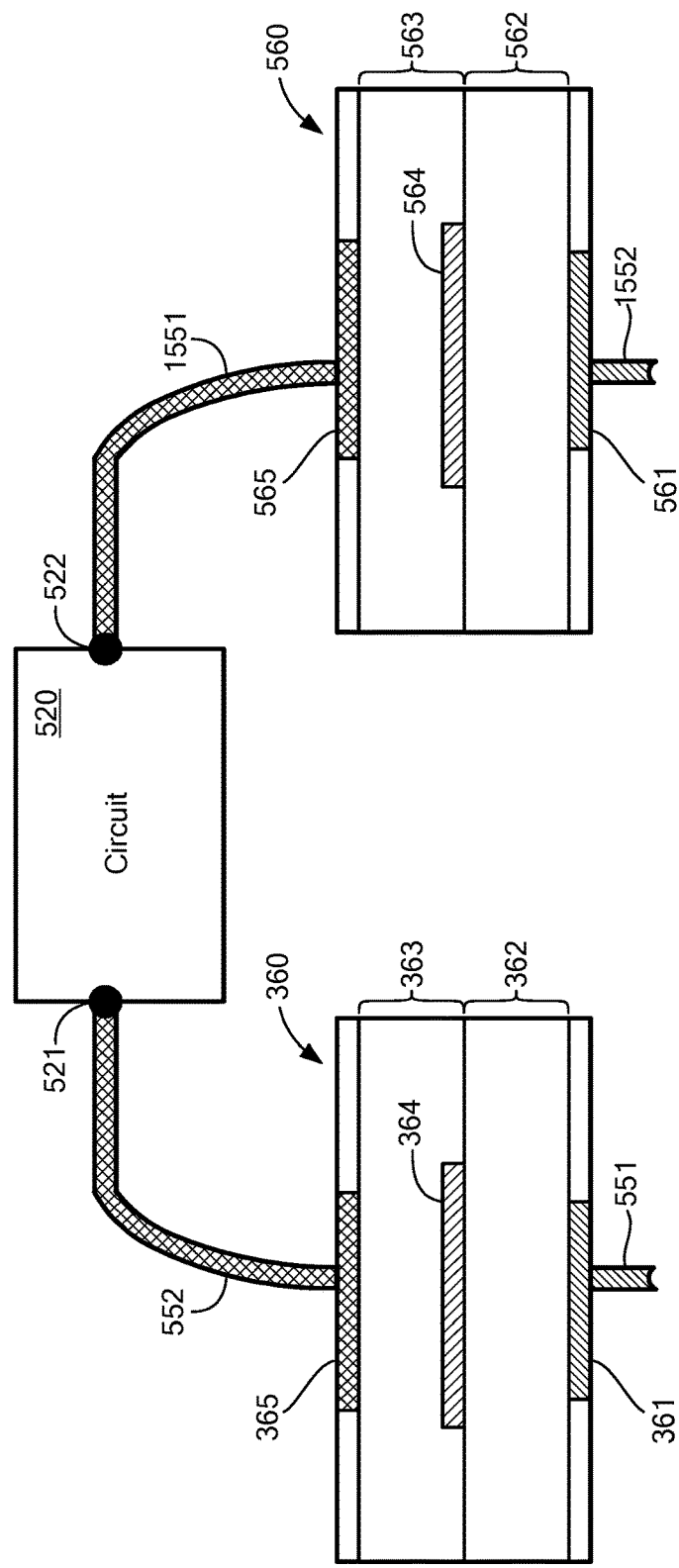
FIG. 5 shows cross-sections of example isolation barriers of a signal isolator IC package in accordance with embodiments of the disclosure.

Referring to FIG. 5, in which like elements of FIG. 3 are shown having like reference designations, cross-sections of first and second example isolation barriers 360, 560 of first and second respective IC package signal paths according to the disclosure are shown. In the illustrated embodiment, the first isolation barrier 360 is shown coupled to a first respective terminal 521 of a circuit 520 through an electrical connection 552 of the first signal path. Additionally, the second isolation barrier 560 is shown coupled to a second respective terminal 522 of the circuit 520 through an electrical connection 1551 of the second signal path. In embodiments, the first signal path also includes an electrical connection 551 and the second signal path includes an electrical connection 1552. In embodiments, at least one of the electrical connections 551, 552, 1551, 1552 of the signals paths includes or is provided as a wirebond.

In embodiments, the first isolation barrier 360 is supported by a first respective die (e.g., 220, shown in FIG. 4) of the IC package including the first isolation barrier 360. Additionally, in embodiments the isolation barrier 560 and the circuit 320 are supported by a second respective die (e.g., 430, shown in FIG. 4) of the IC package including the second isolation barrier 560.

In embodiments, first isolation barrier 360 corresponds to first isolation barrier 260 shown in FIG. 4. Additionally, in embodiments second isolation barrier 560 corresponds to second isolation barrier 460 shown in FIG. 4. Further, in embodiments circuit 520 corresponds to second circuit 120 shown in FIG. 4 or a conductive element.

As illustrated, similar to first isolation barrier 360 described above in connection with FIG. 3, second isolation barrier 560 includes a plurality of conductive layers (here, conductive layers 561, 565), a plurality of insulating layers (here, insulating layers 562, 563), and at least one floating conductive plate (here, floating conductive plate 564).

In the example embodiment shown, conductive layers 561, 565, insulating layers 562, 563 and floating conductive plate 564 of second isolation barrier 560 are substantially the same as conductive layers 361, 365, insulating layers 362, 363 and floating conductive plate 364 of first isolation barrier 360, and thus are not described in detailed again herein. However, as discussed above, it is understood that one or more characteristics (e.g., dimensions and/or materials) of conductive layers, insulating layers and floating conductive plates of isolation barriers according to the disclosure may be selected such that the isolation barriers are able to provide a predetermined level of signal, for example, between a first die (or die area) and a second die (or die area).

In embodiments, isolation barrier 360 can receive signals from a first circuit via electrical connection 551 of the first signal path including isolation barrier 360 and the isolation barrier 360 can transfer the signals to circuit 320 (e.g., a second circuit) via electrical connection 552 of the first signal path. Additionally, in embodiments isolation barrier 560 can receive signals from a third circuit via electrical connection 1552 of the second signal path including isolation barrier 560 and the isolation barrier 560 can transfer the signals to circuit 320 via electrical connection 1551 of the second signal path.

In embodiments in which the third circuit and circuit 320 operate in a same voltage domain, for example, isolation barrier 560 may include a reduced number of isolation layers than that which is shown. For example, in one embodiment, second insulating layer 563 and floating conductive plate 564 can be removed from the isolation barrier 560 such that isolation 560 functions in a same or similar manner as a bypass capacitor type element, for example. In such embodiment, first insulating layer 562 is disposed over first conductive layer 561 and second conductive layer 565 is disposed over first insulating layer 562. In embodiments, as a result of the modified isolation barrier 560 not having floating conductive plate 564, for example, modified isolation barrier 560 may not have some of the advantages of isolation barrier 360 discussed above in connection with FIG. 3. For example, insulating layer 562 in modified isolation barrier 560 may have a reduced lifetime compared to insulating layers 562, 563 in original isolation barrier 560 (and isolation barrier 360). Additionally, modified isolation barrier 560 may provide a reduced amount of signal isolation between the dies (or die areas) on which the third circuit and circuit 320 are supported compared, for example, to original isolation barrier 560.

Conversely, in embodiments in which the third circuit and circuit 320 operate in voltage domains that are significantly different from each other, isolation barrier 560 may include an increased number of layers than that which is shown. For example, in one embodiment, a second conductive plate and a third insulating layer can be added to the isolation barrier 560 to provide an increased level of signal isolation between the dies (or die areas) on which the third circuit and circuit 320 are supported. In such embodiment, the third insulating layer can be disposed between the second insulating layer 562 and the second conductive layer 565 and the second conductive plate can be disposed between the second insulating layer 563 and the third insulating layer. It is understood that other embodiments of isolation barrier 560 and isolation barrier 360 are of course possible.

Figure 6:
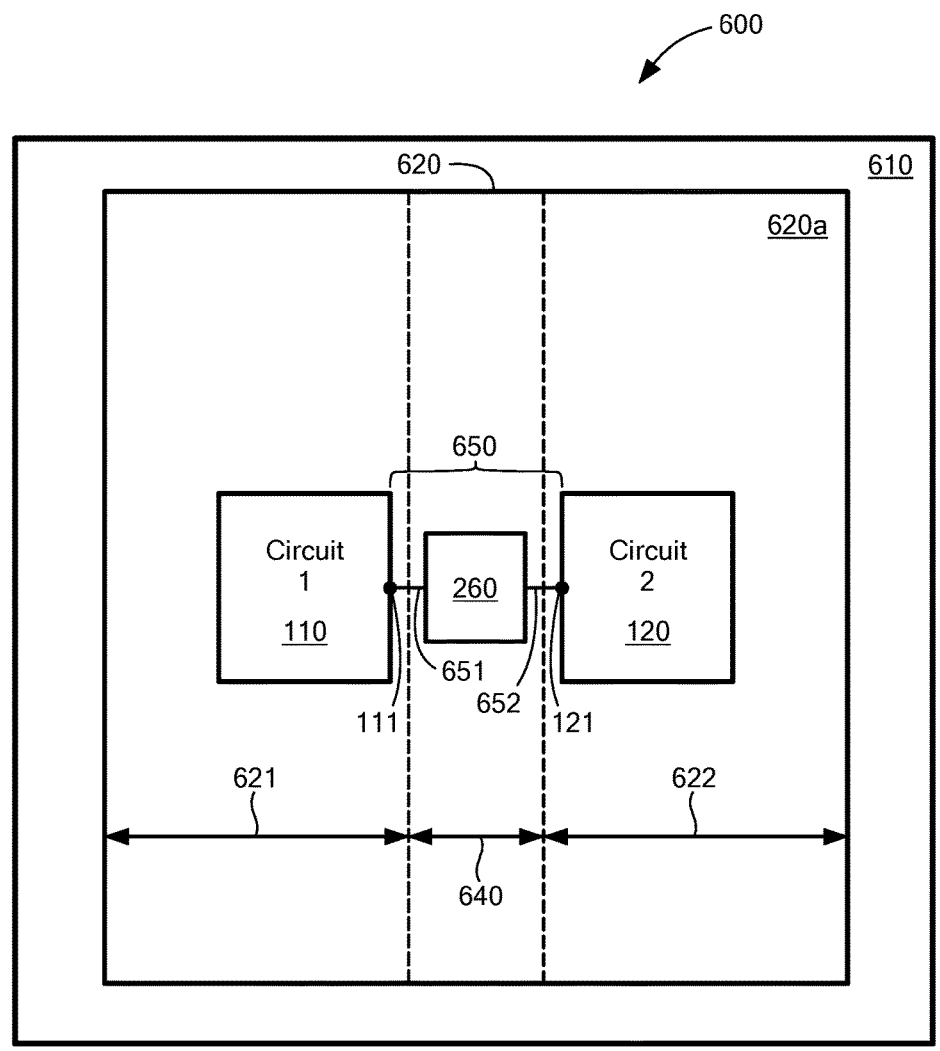
FIG. 6 is a block diagram of a further example signal isolator IC package in accordance with embodiments of the disclosure.

Referring now to FIG. 6, in which like elements of FIGS. 2 and 4 are shown having like reference designations, a further example signal isolator 600 that forms part of a signal isolator IC package 610 includes a die 620 having a first die area 621 and a second die area 622. The IC package 610 also includes a signal path 650 from the first die area 621 to the second die area 622. In the example embodiment shown, the signal path 650 includes a first electrical connection 651, a second electrical connection 652 and an isolation barrier 660. Additionally, in the example embodiment shown, the signal path 650 extends from the first die area 621 to the second die area 622 across a spacing 640 between the first and second die areas 621, 622. In embodiments, the spacing 240 (in conjunction with isolation barrier 660 and/or other isolation means) provides galvanic isolation between the first and second die areas 621, 622.

In the illustrated embodiment, first isolation barrier 260, first circuit 110 and second circuit 120 are each supported by a respective surface 620a (e.g., an active surface) of the die 620. More particularly, the first circuit 120 is supported by a selected portion of surface 620a on the first die area 621 of the die 620 and the second circuit 120 is supported by a selected portion of surface 620a on the second die area 622 of die 620. Additionally, the first isolation barrier 260 is supported by a selected portion of surface 620a between the first and second die areas 621, 622 in the illustrated embodiment. In embodiments, the first isolation barrier 260 may alternatively be supported by a selected portion of a respective one of the first and second die areas 621, 622.

In the illustrated embodiment, terminal 111 of the first circuit 110 is coupled to the first portion of the first isolation barrier 260 through first electrical connection 651 of the signal path 650. Additionally, terminal 121 of the second circuit 120 is coupled to the second portion of the first isolation barrier 260 through second electrical connection 652 of the signal path 650. In embodiments, the first circuit 110 and the first die area 621 operate in a first voltage domain and the second circuit 120 and the second die area 622 operate in a second voltage domain that is substantially different from the first voltage domain. In embodiments, the first voltage domain in which first circuit 110 and first die area 621 may operate in signal isolator IC package 610 is substantially closer to the second voltage domain in which second circuit 120 and second die area 622 may operate in signal isolator IC package 610 than the first and second voltage domains in which the first and second circuits 110, 120 and first and second die 220, 230 operate in signal isolator IC package 210 described above in connection with FIG. 2, for example. As illustrated, the foregoing may reduce a need to provide the second circuit 120 on a different die from the first circuit 110 in signal isolator IC package 610.

With the above-described arrangement of IC package 610, an output signal of the first circuit 110 can be received by the second circuit 120 with signal isolation via isolation barrier 260. Additionally, with the above-described arrangement of IC package 610, an output signal of the second circuit 120 can be received by the first circuit 110 with signal isolation via isolation barrier 260. In embodiments, isolation barrier 260 may be the same as or similar to isolation barrier 360 described above in connection with FIG. 3, for example.

It should be appreciated that the signal isolator IC packages shown and described in connection with figures above (e.g., 610, shown in FIG. 6) are but several of many potential configurations of signal isolator IC packages in accordance with the embodiments of the disclosure. As one example, a signal isolator IC package according to a further embodiment of the disclosure may take the form of a three-dimensional (3D) IC package including a plurality of vertically stacked die and an isolation barrier (or barriers) supported by respective die of the IC package. The 3D IC package, similar to IC packages shown and described in connection with figures above, may support two or more voltage domains.

Additionally, it should be appreciated that the example isolation barriers of the signal isolator IC packages shown and described in connection with figures above (e.g., 360, shown in FIG. 3) are but several of many potential configurations of isolation barriers in accordance with the embodiments of the disclosure. For example, while the isolation barriers are shown as including a particular number of conductive layers, insulating layers, and floating conductive plates (collectively, "isolation layers"), it should be appreciated that isolation barriers in accordance with embodiments of the disclosure may include more the particular number of isolation layers in some embodiments.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A signal isolator integrated circuit package, comprising:
  a first die in a first voltage domain;
  a second die in a second voltage domain, wherein the first and second die are galvanically isolated; and
  a first signal path from the first die to the second die via a first isolation barrier supported by the first die, the first isolation barrier comprising:
    a first conductive layer disposed over a surface of the first die;
    a first insulating layer disposed over the first conductive layer;
    a second insulating layer disposed over the first insulating layer;
    a second conductive layer disposed over the second insulating layer; and
    a first floating conductive plate disposed between the first insulating layer and the second insulating layer.

2. The integrated circuit package according to claim 1, wherein at least one edge of the first floating conductive plate extends beyond an edge of the first conductive layer to increase evenness of electric charge distribution.

3. The integrated circuit package according to claim 1, wherein the first insulating layer and the second insulating layer each have a respective thickness, and the thickness of at least one of the first insulating layer and the second insulating layer is selected to provide a first predetermined level of signal isolation between the first die and the second die.

4. The integrated circuit package according to claim 1, wherein the first insulating layer and the second insulating layer have a substantially similar thickness.

5. The integrated circuit package according to claim 1, wherein at least one of the first insulating layer and the second insulating layer comprises a plurality of layers including one or more insulating materials.

6. The integrated circuit package according to claim 1, wherein the first conductive layer and the second conductive layer each have a respective thickness, and the thickness of at least one of the first conductive layer and the second conductive layer is selected to provide a first predetermined level of signal isolation between the first die and the second die.

7. The integrated circuit package according to claim 1, wherein the first floating conductive plate is spaced substantially equidistant from the first conductive layer and the second conductive layer.

8. The integrated circuit package according to claim 1, wherein the first signal path comprises one or more wirebonds.

9. The integrated circuit package according to claim 1, wherein the second die has a first die area in the second voltage domain and a second die area in a third voltage domain, and the integrated circuit package further comprises: a second signal path from the first die area to the second die area via a second isolation barrier supported by the second die, the second isolation barrier comprising:
   a third conductive layer disposed over a surface of the second die;
   a third insulating layer disposed over the third conductive layer; and
   a fourth conductive layer disposed over the third insulating layer.

10. The integrated circuit package according to claim 9, wherein the second isolation barrier further comprises:
   a second floating conductive plate disposed between the third insulating layer and the fourth conductive layer; and
   a fourth insulating layer disposed between the second floating conductive plate and the fourth conductive layer.

11. The integrated circuit package according to claim 10, wherein the third insulating layer and the fourth insulating layer each have a respective thickness, and the thickness of at least one of the third insulating layer and the fourth insulating layer is selected to provide a second predetermined level of signal isolation between the first die area and the second die area.

12. The integrated circuit package according to claim 10, wherein the second floating conductive plate is spaced substantially equidistant from the third conductive layer and the fourth conductive layer.

13. The integrated circuit package according to claim 9, wherein the third conductive layer and the fourth conductive layer each have a respective thickness, and the thickness of at least one of the third conductive layer and the fourth conductive layer is selected to provide a second predetermined level of signal isolation between the first die area and the second die area.

14. A signal isolator integrated circuit package, comprising:
   a first die having a first die area in a first voltage domain and a second die area in a second voltage domain, wherein the first and second die areas are galvanically isolated; and
   a first signal path from the first die area to the second die area via a first isolation barrier supported by the first die, the first isolation barrier comprising:
      a first conductive layer disposed over a surface of the first die;
      a first insulating layer disposed over the first conductive layer;
      a second insulating layer disposed over the first insulating layer;
      a second conductive layer disposed over the second insulating layer; and
      a first floating conductive plate disposed between the first insulating layer and the second insulating layer.

15. The integrated circuit package according to claim 14, wherein at least one edge of the first floating conductive plate extends beyond an edge of the first conductive layer to increase evenness of electric charge distribution.

16. The integrated circuit package according to claim 14, wherein the first insulating layer and the second insulating layer each have a respective thickness, and the thickness of at least one of the first insulating layer and the second insulating layer is selected to provide a first predetermined level of signal isolation between the first die area and the second die area.

17. The integrated circuit package according to claim 14, wherein the first conductive layer and the second conductive layer each have a respective thickness, and the thickness of at least one of the first conductive layer and the second conductive layer is selected to provide a first predetermined level of signal isolation between the first die area and the second die area.

18. The integrated circuit package according to claim 14, wherein the first floating conductive plate is spaced substantially equidistant from the first conductive layer and the second conductive layer.

19. The integrated circuit package according to claim 14, further comprising:
   a second die in a third voltage domain, wherein the first and second die are galvanically isolated; and
   a second signal path from the second die area of the first die to the second die via a second isolation barrier supported by one of the first die and the second die, the second isolation barrier comprising:
      a third conductive layer disposed over a surface of the second die;
      a third insulating layer disposed over the third conductive layer;
      a fourth insulating layer disposed over the third insulating layer;
      a fourth conductive layer disposed over the fourth insulating layer; and
      a second floating conductive plate disposed between the third insulating layer and the fourth insulating layer.

20. The integrated circuit package according to claim 19, wherein the third insulating layer and the fourth insulating layer each have a respective thickness, and the thickness of at least one of the third insulating layer and the fourth insulating layer is selected to provide a second predetermined level of signal isolation between the first die area and the second die area.

* * * * *